United States Patent
Marchetti

(10) Patent No.: US 11,378,293 B1
(45) Date of Patent: Jul. 5, 2022

(54) ACCESS FLOOR SMART TILE FOR REFRIGERANT DETECTION

(71) Applicant: UNIFLAIR S.P.A., Conselve (IT)

(72) Inventor: Daniele Marchetti, Chioggia (IT)

(73) Assignee: UNIFLAIR S.p.A., Conselve (IT)

( * ) Notice: Subject to any disclaimer, the term of this patent is extended or adjusted under 35 U.S.C. 154(b) by 0 days.

(21) Appl. No.: 17/126,747

(22) Filed: Dec. 18, 2020

(51) Int. Cl.
| | |
|---|---|
| *F24F 11/02* | (2006.01) |
| *F24F 11/36* | (2018.01) |
| *F25B 49/00* | (2006.01) |
| *F25D 27/00* | (2006.01) |
| *F24F 11/56* | (2018.01) |

(52) U.S. Cl.
CPC ............... *F24F 11/36* (2018.01); *F24F 11/56* (2018.01); *F25B 49/005* (2013.01); *F25D 27/005* (2013.01); *F25B 2400/12* (2013.01); *F25B 2500/222* (2013.01); *F25B 2600/07* (2013.01)

(58) Field of Classification Search
CPC ......... F24F 11/36; F24F 11/56; F25B 49/005; F25B 2400/12; F25B 2500/222; F25B 2600/07
See application file for complete search history.

(56) References Cited

U.S. PATENT DOCUMENTS

| | | |
|---|---|---|
| 2015/0025690 A1 | 1/2015 | Abuelsaad et al. |
| 2016/0245566 A1* | 8/2016 | Hiraki ...................... F24F 11/77 |

OTHER PUBLICATIONS

Extended European Search Report from corresponding European Application No. 21212023.2 dated May 13, 2022.

* cited by examiner

*Primary Examiner* — Jonathan Bradford
(74) *Attorney, Agent, or Firm* — Lando & Anastasi, LLP

(57) ABSTRACT

A floor system for detecting refrigerant includes one or more tiles. Each tile includes a tile body having a cavity formed therein and a grille element positioned within the cavity of the tile body. The grille element is configured to receive air from at least one of above or below the tile body. Each tile further includes a control assembly associated with the grille element. The control assembly includes a refrigerant sensing device to detect refrigerant in the received air. The control assembly is configured to output a signal indicating a detection of refrigerant.

24 Claims, 7 Drawing Sheets

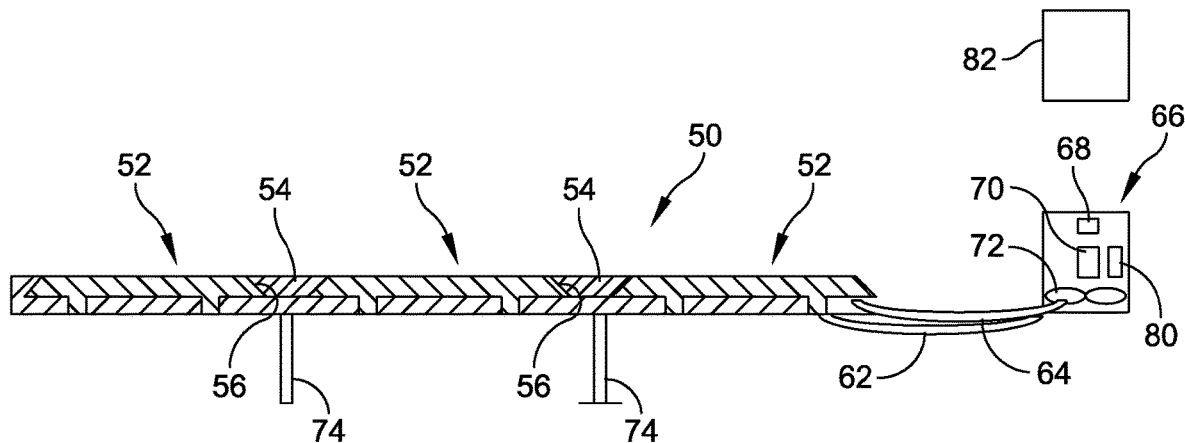
FIG. 3A
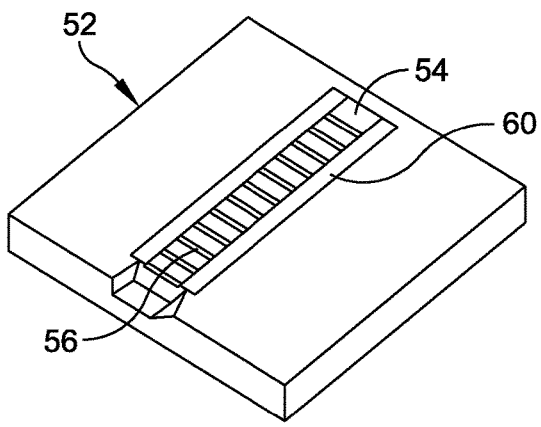
FIG. 3B
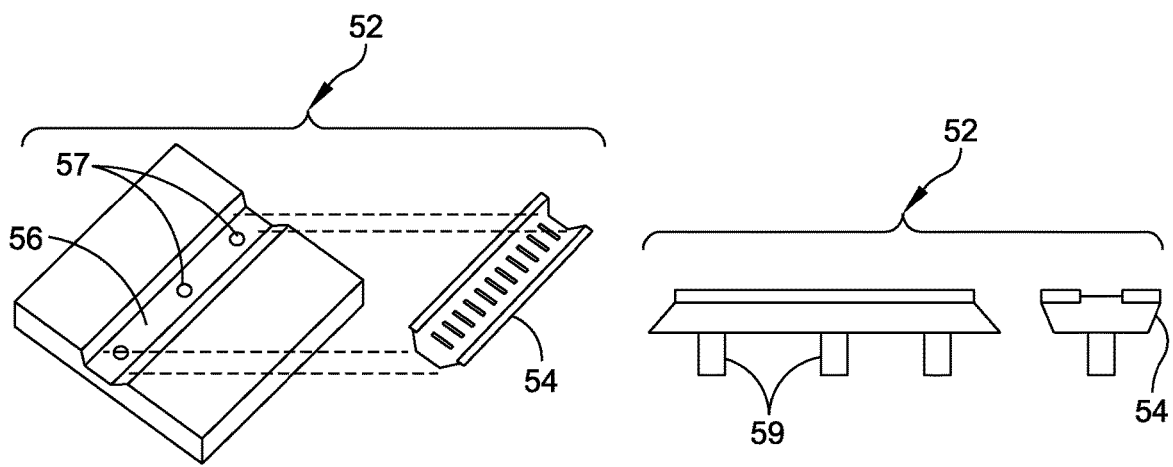
FIG. 3C
FIG. 3D

ACCESS FLOOR SMART TILE FOR REFRIGERANT DETECTION

BACKGROUND OF DISCLOSURE

1. Field of Disclosure

Embodiments of the disclosure relate generally to detection systems, and more specifically to systems and methods for detecting leaks of fluid that may damage electronic equipment. In one embodiment, the present disclosure relates a smart tile to be used in an access floor. The smart tile is able to detect refrigerant leakage and provide information about the leak to a remote device.

2. Discussion of Related Art

To reduce carbon footprint, refrigerants with low global warming potential are presently being introduced in the market and will be used more and more extensively in the future. Most of these new refrigerants are mildly flammable. The management of such refrigerants in a controlled environment, such as a data center, can be critical because in case of leakage, refrigerants can accumulate and sometimes reach a dangerous concentration. In a data center, there may be points of ignition, which can be dangerous. For this reason, an accurate detection of refrigerant leakage is highly desirable in the entire data center. These types of refrigerants are heavier than air so the refrigerant can accumulate over the floor in the event of a leak. The detection of leakage is particularly relevant when in a data center a false floor is installed to distribute the cool air to the server racks under the floor. A plenum under the floor can facilitate refrigerant accumulation, so in the case of a false floor, it may be desirable to detect refrigerant leaks both over and below the floor at the same time.

Currently, refrigerant leakage may be detected by dedicated sensing devices placed strategically within the data center. A simple approach is to place a single sensing device in each zone to be monitored. This approach is expensive when a large area must be monitored, such as in a large data center. An alternative approach is to use only one sensing device and a piping network able to draw air from multiple points. The drawn air collected on a main manifold is detected by one single sensing device. This last approach has the disadvantage to be invasive, e.g., a pipe must be installed where presumably refrigerant can accumulate, and not flexible to address another zone that is later added or moved from the existing system.

One aspect of the present disclosure is directed to detecting refrigerant leaks in a data center, especially if the data center has a false floor.

SUMMARY OF DISCLOSURE

Data centers are often assembled on raised-floor tiles that provide a space below IT equipment for routing cables and cold air. One embodiment of the present disclosure is directed to a tile, sometimes referred to herein as a "smart tile," that draws air in from around the tile, analyzes the air with a built-in monitor, and issues an alarm if a sensor associated with the tile detects high refrigerant concentrations, e.g., changing the color of an LED in the tile. The tile may be configured to transmit an alarm signal wirelessly, sounding an audible alarm.

One aspect of the present disclosure is directed to a floor system for detecting refrigerant. In one embodiment, the floor system comprises one or more tiles, each tile including a tile body having a cavity formed therein and a grille element positioned within the cavity of the tile body. The grille element is configured to receive air from at least one of above or below the tile body. Each tile further includes a control assembly associated with the grille element. The control assembly includes a refrigerant sensing device to detect refrigerant in the received air. The control assembly is configured to output a signal indicating a detection of refrigerant.

Embodiments of the floor system further may include the control assembly further having a fan to draw in the received air into the grille from at least one of above or below the tile body. The floor system further may include one or more light element configured to indicate a detection of refrigerant detected by the refrigerant sensing device. The one or more light element may include at least one of a first color light to indicate normal operation or a second color light to indicate an alarm related to the refrigerant sensing device. The control assembly may include a control box, and wherein each grille element is positioned inside the control box. The floor system further may include a wireless communication network. Each tile may be powered by a power source coupled to the control assembly. The grille element may have a shape that is configured to fit within a mating shaped cavity in the body of the tile. Each grille element may be connected to a grille element of an adjacent tile by a pipe element. The control assembly may be provided in the grille element. One or more tiles may be supported above a floor by one or more supports, with the one or more tiles defining a top surface of a plenum through which air can be delivered to racks containing electronic equipment. The control assembly further may include a communication module configured to create a communication network with other tiles of the one or more tiles. The control assembly may be configured to communicate with a central station in which the central station is configured to receive an alarm from any tile in case of refrigerant leakage detection by the sensing device. Each grille element may be connected to an adjacent grille element by a connection element, with the control assembly being positioned remote from the tile. Each connection element may be located along a respective side of the grille element and provided with snap connection devices configured to solidly connect the grille elements to establish a continuity of a channel and of an electrical circuit for an alarm light by means of electrical contacts. Each tile may be powered by a mini turbine and power generator coupled to the tile by pressure existing under the floor. The body of the tile may include a depressurized area and one or more channels. The system further may be configured to create a venturi effect adjacent the depressurized area to draw air through the one or more channels. The one or more tiles may be supported above a floor by one or more supports, the one or more supports each being configured to deliver power to the control assembly of the one or more tiles.

Another aspect of the present disclosure is directed to one or more non-transitory machine-readable media storing instructions that, when executed by one or more processors, cause: detecting refrigerant in received air by a refrigerant sensing device of a control assembly of one or more tiles of a floor system for detecting refrigerant, with each tile including a tile body having a cavity formed therein and a grille element positioned within the cavity of the tile body, the control assembly being associated with the grille element; and outputting a signal indicating a detection of refrigerant.

Embodiments of the one or more non-transitory machine-readable media further storing instructions that, when executed by one or more processors, may cause drawing in the received air into the grille from at least one of above or below the tile body. Outputting a signal indicating a detection of refrigerant may include activating one or more light element including at least one of a first color light to indicate normal operation or a second color light to indicate an alarm related to the refrigerant sensing device. The one or more non-transitory machine-readable media further may include a wireless communication network. Each tile may be powered by a power source coupled to the control assembly. The control assembly further may include a communication module configured to create a communication network with other tiles of the one or more tiles. The one or more non-transitory machine-readable media further storing instructions that, when executed by one or more processors, may cause communicating with a central station in which the central station is configured to receive an alarm from any tile in case of refrigerant leakage detection by the sensing device.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 3A is a schematic view of a system of a plurality of tiles of another embodiment of the present disclosure that are configured to detect refrigerant leaks;

FIG. 3B is a perspective view of a tile shown in FIG. 3A;

FIG. 3C is a perspective view of the tile shown in 3B with a grille element removed from the tile;

FIG. 3D is a side view of the tile shown in FIG. 3B with the grille element removed from the tile;

DETAILED DESCRIPTION

Figure 1A:
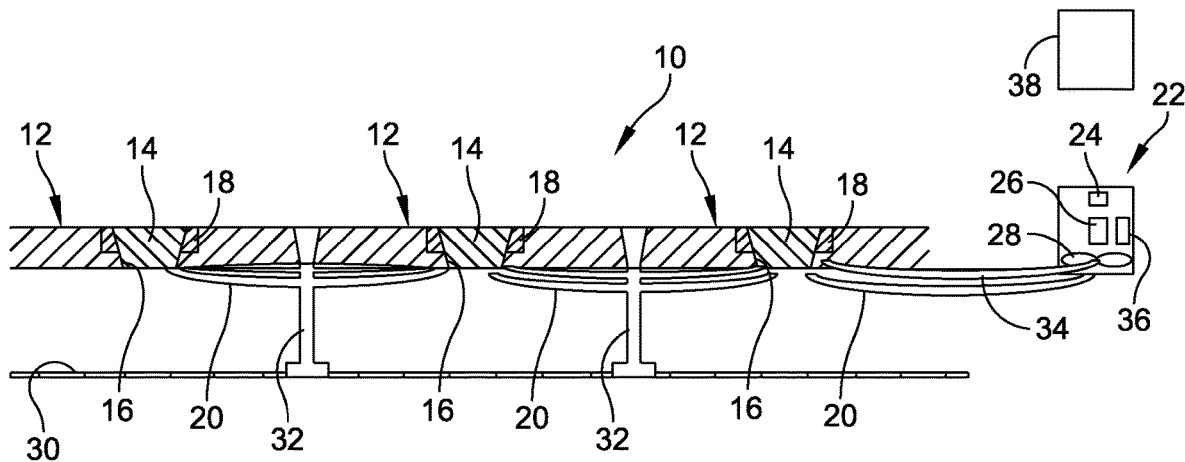
FIG. 1A is a schematic side view of a system of a plurality of tiles of an embodiment of the present disclosure that are configured to detect refrigerant leaks.

It is to be appreciated that embodiments of the systems and methods discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

At least one embodiment of the present disclosure is directed for use with electronic equipment that is housed within equipment enclosures or racks of a data center. As used herein, "enclosures" and "racks" are used to describe apparatus designed to support electronic equipment. Data centers are typically large rooms designed, in certain instances, to house hundreds of electronic equipment racks arranged in rows within the data center. However, data centers are not limited to large rooms but instead can embody medium to small rooms, including wiring closets. Cooling equipment is provided in the data center to treat the hot air produced by the electronic equipment. During operation, the cooling equipment produces moisture and condensation from within the data center's environment, which may be excessive. In addition, certain cooling equipment is coupled to refrigerant distribution units or to chillers to assist in the operation of the cooling equipment. Leaks from hoses or connections of these units and chillers, as described above, may produce fluid within the data center as well, which is undesirable.

Figure 1B:
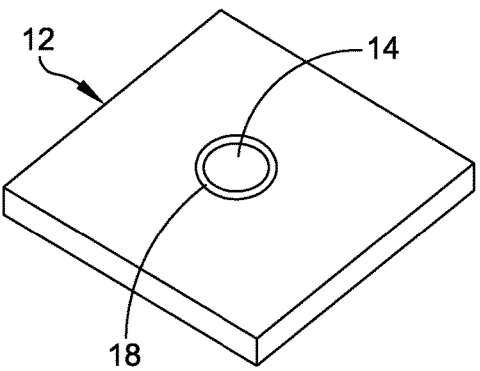
FIG. 1B is a perspective view of a tile shown in FIG. 1A.
Figure 1C:
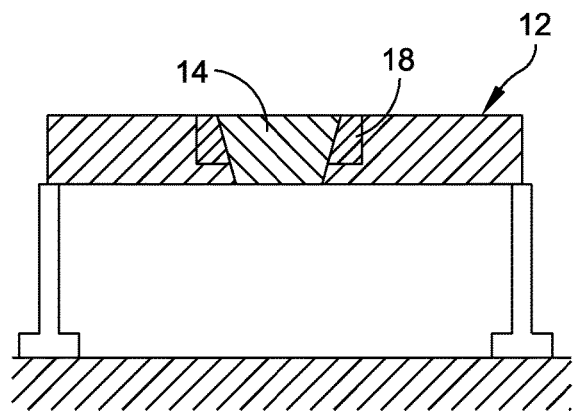
FIG. 1C is a schematic side view of a tile shown in FIG. 1A.

Referring to the drawings, and more particularly to FIG. 1A, a system configured to detect leaked refrigerant is generally indicated at 10. In one embodiment, shown in greater detail in FIGS. 1B and 1C, the system 10 includes a plurality of tiles, each generally indicated at 12, which in the shown embodiment has a square-shaped body having a predetermined thickness. It should be understood that the tile 12 can be configured to achieve any shape and size depending on the intended use and look desired. The system 10 further includes a grille element 14, which is centrally located within a cavity 16 formed in the tile body, with the cavity being shaped to receive the grille element. In the shown embodiment, the grille element 14 is frusto-conically-shaped and is shaped and sized to be received within a frusto-conically-shaped cavity 16 formed in the body of the tile 12. Other shapes and sizes of the grille element 14 and the cavity 16 can be employed.

In one embodiment, the system 10 includes one or more light elements, each indicated at 18, arranged around a periphery of the grille element 14. In a certain embodiment, the light elements 18 may be light emitting diodes (LEDs). The light elements 18 may take the form of other embodiments, such as light pipes. Each grille element 14 is connected to a grille element 14 of an adjacent tile 12 by a pipe element 20, which can be fabricated from plastic.

The system 10 further includes a control station, generally indicated at 22, which in the shown embodiment is positioned at a location remote from the tiles 12 and configured to be coupled to the grille elements 14. Other embodiments described herein show the control station as being proximate to or integrated with the tile. As shown in FIG. 1A, the control station 22 includes a controller 24, a sensing device 26 and a fan 28. The sensing device 26 is configured to detect refrigerant, in air delivered to the control station 22 via pipe elements 20. The fan 28 is configured to draw air from the grille elements 14 of the tiles 12 to the control station 22 and present the air to the sensing device 26 for detection. The controller 24 is configured to control the operation of the sensing device 26 and the fan 28, and may be in communication with a control system or subsystem associated with the data center to alert an operator of a detected leak.

As shown, the tiles 12 are supported above a floor 30 of the data center room by supports, each indicated at 32, to define a plenum between the floor and the tiles through which cooled air can be delivered to racks containing electronic equipment. In one embodiment, air above and below the grille element 14 of each tile 12 is drawn into the grille element. Air within the grille elements 14 is drawn to the control station 22 by the fan 28 through the pipe elements 20 that interconnect the grille elements with the control station. The sensing device 26 is configured to detect moisture within the air.

In one embodiment, power is provided to the control station 22 by a power supply connected to the control station by any suitable means, e.g., a power cord. The power supplied to the control station 22 can be a dedicated power supply, or be provided serially from control station to control station or in parallel between groups of control stations.

In operation, each tile 12 of system 10 as described above, draws air both above and below the floor defined by the tiles in a continuous fashion. In one embodiment, in the event of the presence of refrigerant in the air, a signal is sent from the control station 22 to a central station of the data center, which, in turn, can generate a signal to trigger an alarm or suitable warning to take countermeasures against the refrigerant leak. If, for any reason, there is the need to monitor a new zone, a tile 12 can be easily moved or added to the system 10 to monitor the new zone.

In some embodiments, the light elements 18 are connected to the control station 22 by electrical wires 34 as shown in FIG. 1A. In one example, the light elements 18 may include a first color, e.g., green lights, for normal operation and a second color, e.g., red lights, for an alarm.

In some embodiments, the sensing device 26 of the control station 22 is configured to detect refrigerant dispersed in the air.

In some embodiments, the control station 26 includes a communication module 36 configured to create a communication network among other tiles and a central station, such as central station 38, with the central station being able to receive a signal triggering an alarm from any tile in case of refrigerant leakage detection.

As used herein, a refrigerant is a substance or mixture, usually a fluid, used in a refrigeration system. In most cycles the refrigerant is capable of undergoing a phase transition from a liquid to a gas and back to a liquid. Refrigerants include, among other substances, fluorocarbons, ammonia, sulfur dioxide, or propane. It should be understood that a refrigerant includes any substance that functions as a refrigerant but may not be technically a refrigerant.

Figure 2:
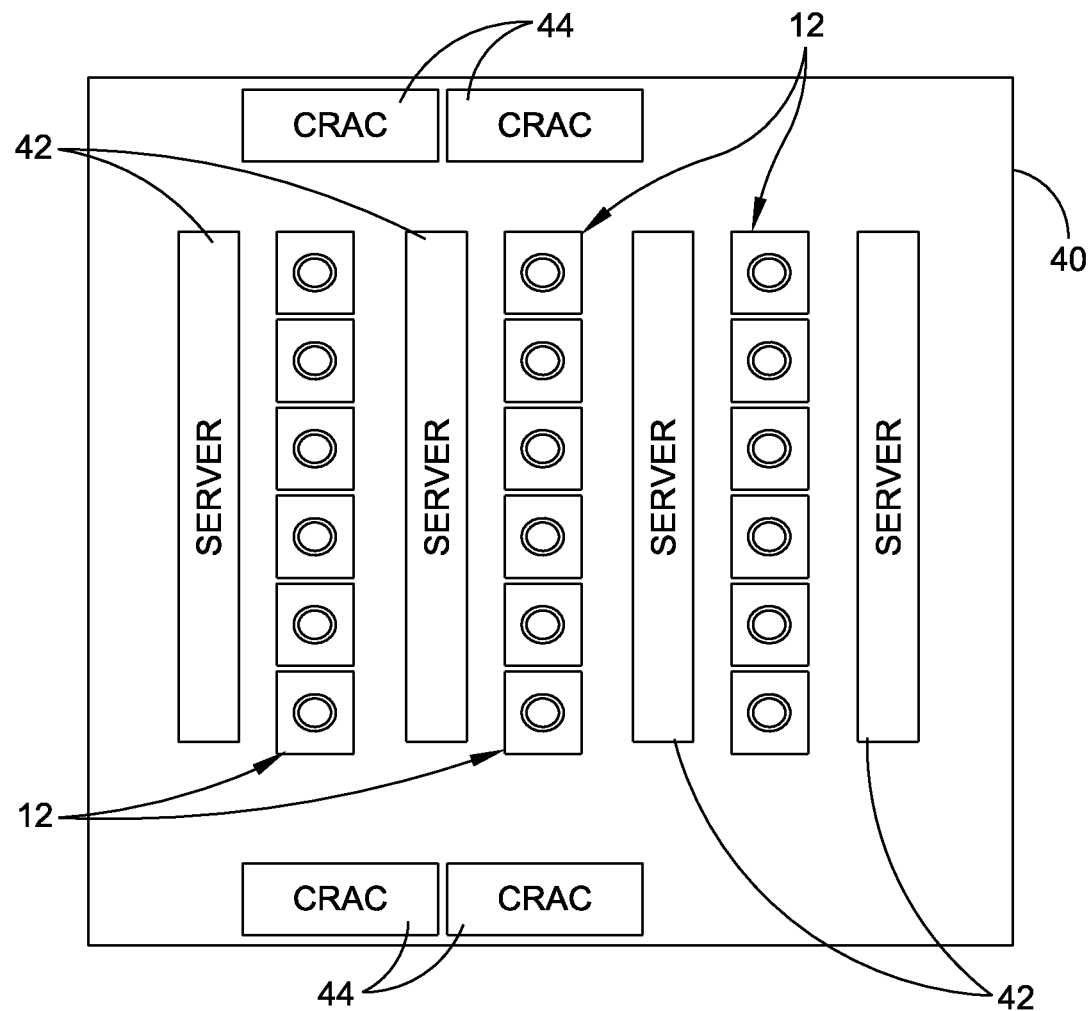
FIG. 2 is a schematic view of an exemplary arrangement of tiles shown in FIG. 1 within a data center.

Referring to FIG. 2, an exemplary configuration of tiles 12 within a room 40 of a data center or a portion of a data center are shown. As shown, the room 40 includes several rows of servers, each indicated at 42, which are arranged parallel to one another. The room 40 further may include one or more computer room air conditioning (CRAC) units, each indicated at 44, which are configured to provide localized cool air within the room of the data center. Specifically, CRAC units 44 can be configured to provide precision cooling and are a component for the optimum performance of data center hardware, such as servers, storage, networking, and communication systems. Cooling units can also be employed between the equipment racks to provide additional or strategic cooling. As discussed above, the cooling units in the data center, including CRAC units 44, may be connected to a source of refrigerant.

Between adjacent rows of servers are a line of tiles 12, with each tile being configured to draw air through its grille element 14 to the control station 22 for detection. It should be understood that the room 40 of the data center can be arranged in any suitable manner with the tiles 12 strategically positioned to detect refrigerant leaks from cooling units positioned within the rows of equipment racks and/or the CRAC units 44.

Referring to FIGS. 3A-3D, a system of another embodiment is generally indicated at 50. As shown, the system 50 includes a plurality of tiles, each generally indicated at 52. Tiles 52 are similar to tiles 12 except as described below. The system 50 further includes an elongate, linear grille element 54, which is centrally located along an axis bisecting the tile within a cavity 56 formed in a body of the tile. As with cavity 16 of tile 12, the cavity 56 of tile 52 is shaped to receive the grille element 54. Specifically, in the shown embodiment, the linear grille element 54 is wedge-shaped in cross section, and is shaped and sized to be received within the wedge-shaped cavity 56 formed in the tile.

Referring particularly to FIGS. 3C and 3D, the tile 52 includes the cavity 56 formed on an upper surface of the tile 52 and holes 57 formed in a bottom surface of the tile, with the holes being in fluid communication with the cavity. The cavity 56 is configured to receive the grille element 54, which has a grille on the top of the grille element and hollow pins 59 on the bottom of the grille element (FIG. 3D), with the pins extending into the holes 57, respectively. In operation, the grille element 54 is configured to draw air both from the top of the grille element and the bottom of the grille element.

Figure 4:
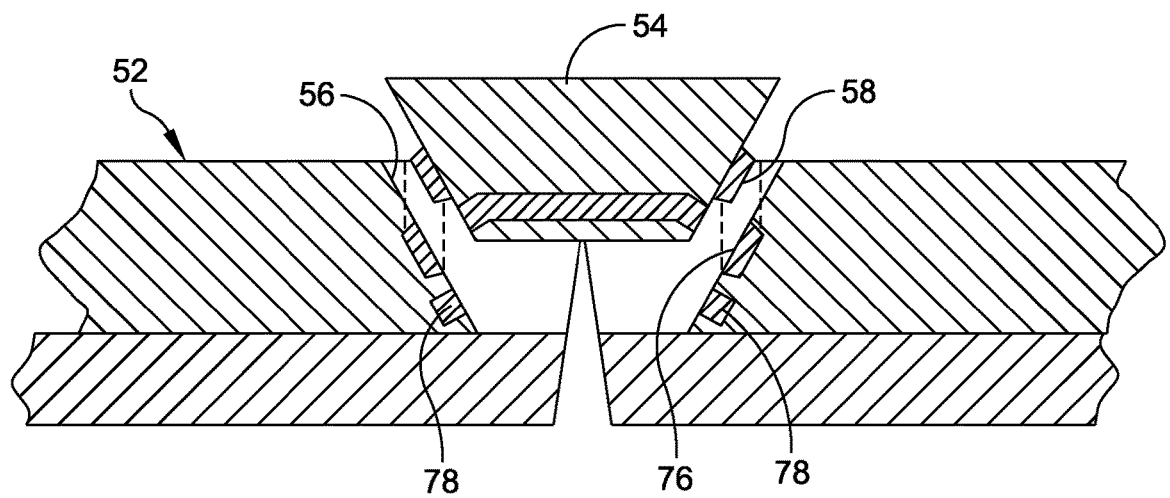
FIG. 4 is a detailed schematic view of grille elements and connection elements of the systems shown in FIGS. 1 and 3.

Referring additionally to FIG. 4, the system 50 further includes a connection device 58 configured to secure the grille element 54 to the tile body within cavity 56 formed in the tile 52. The description of the operation of the connection device 58 will be described in greater detail below. The grille element of the system 50 further includes light elements 60, which in the shown embodiment are positioned along adjacent long edges of the grille element 54 to provide light on both sides of the grille element. The system 50 further includes a pipe 62 to provide fluid communication to and from the grille element 54 and a distribution line 64 to provide power and signal to and from the tiles 52. In one embodiment, each grille element 54 is connected to an adjacent grille element by a connection element associated with the grille element.

The system 50 further includes a control station 66, which is coupled to the grille elements 54 by the pipe 62 and the distribution line 64. As shown, the control station 66 includes a controller 68, a sensing device 70 and a fan 72. The sensing device 70 is configured to detect moisture, e.g., refrigerant, in air delivered to the control station 66 by the pipe 62. The fan 72 is configured to draw air from the linear grille elements 54 of the tiles 52 to the control station 66 and present the air to the sensing device 70 for detection. The controller 68 is configured to control the operation of the sensing device 70 and the fan 72, and may be in communication with a control system associated with the data center.

As shown, the tiles 52 are supported above a floor of the data center room by supports, each indicated at 74, to define a plenum through which cooled air can be delivered to racks containing electronic equipment. In one embodiment, air above and below the grille element 54 of each tile 52 is drawn into the grille element. Air within the grille element 54 is drawn to the control station 66 by the fan 72 through the pipe 62 that interconnect the grille elements with the control station. The sensing device 70 is configured to detect moisture within the air.

In one embodiment, power is provided to the control station 66 of each tile 52 by a power supply connected to the control station by any suitable means, e.g., a power cord provided in the distribution line 62. The power supplied to the control stations 66 can be a dedicated power source or be provided serially from control station to control station or in parallel between groups of control stations.

In operation, each tile 52 of system 50 as described above, draws air both above and below the floor defined by the tiles in a continuous fashion. In the event of the presence of refrigerant in the air, a signal is sent from the control station 66 to the central station of the data center that, in turn, can generate a signal to trigger an alarm or other notification to take countermeasures against the refrigerant leak. If, for any reason, there is the need to monitor a new zone, a tile 52 can be easily moved or added to the system 50.

With particular reference to FIG. 4, the grille element 54 and the connection devices 58 are shown in greater detail. An upper surface of each tile 52 is formed with the cavity 56 in which the connection devices 58 of the grille element 54 can be located and positioned. Each connection device 58 is located along a respective side of the grille element 54 and the upper surface of the cavity 56 is provided with snap connection devices, indicated at 76, which are configured to solidly connect the grille element 54 to establish a continuity of an electrical circuit for the alarm light, e.g., light elements 60, by means of the electrical contacts, each indicated at 78.

In one embodiment, the system 50 can include a second type of grille element that is used to connect two adjacent grille elements 54 to provide fluid, energy and signal communication within the system.

In one embodiment, the light elements 60 may include a first color, e.g., green lights, for normal operation and a second color, e.g., red lights, for an alarm.

In some embodiments, the control station 66 includes a communication module 80 configured to create a communication network among other tiles and a central station, such as central station 82, with the central station being able to receive a signal triggering an alarm from any tile in case of refrigerant leakage detection.

Figure 5:
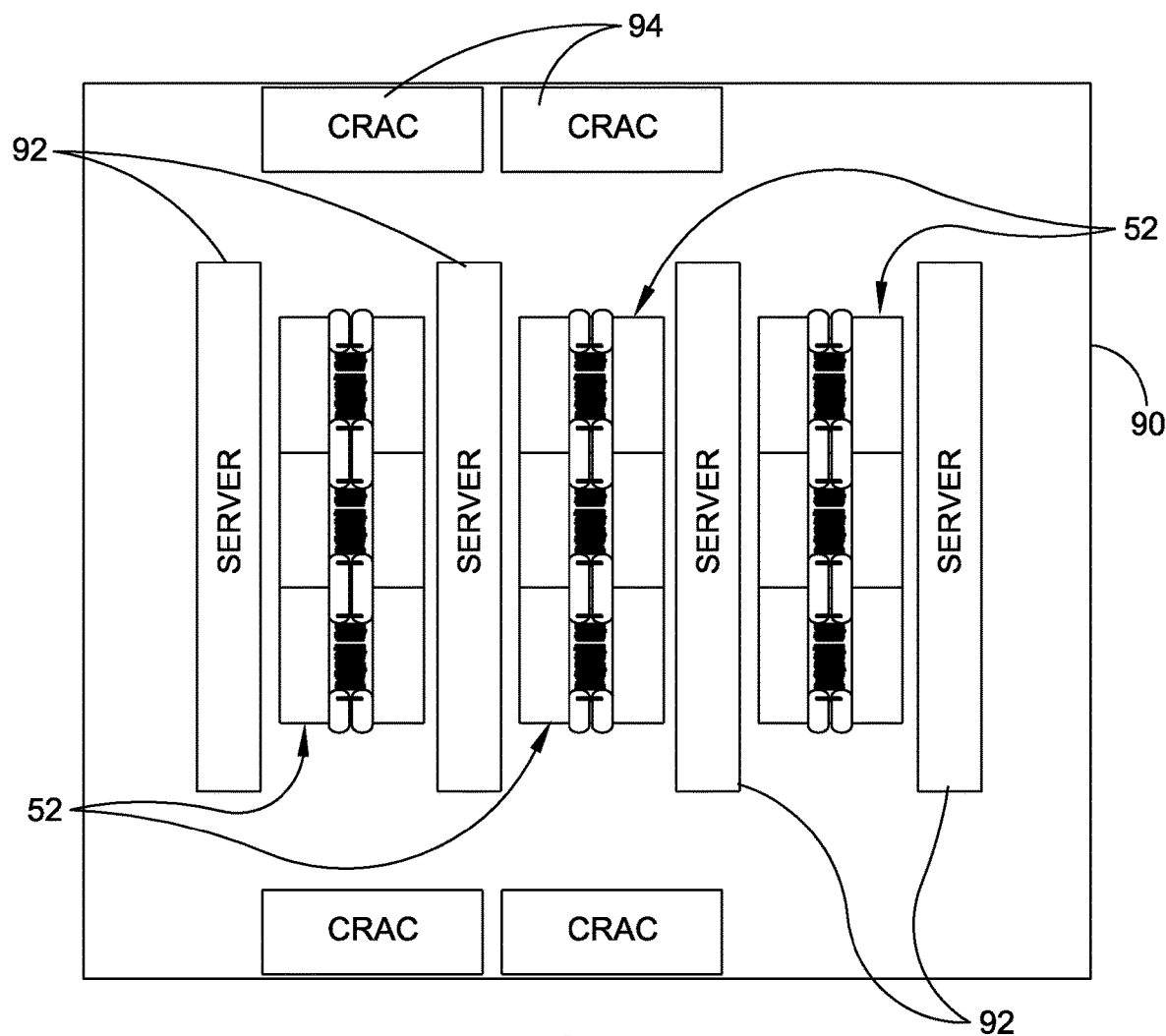
FIG. 5 is a schematic view of an exemplary arrangement of tiles shown in FIG. 3 within a data center.

Referring to FIG. 5, an exemplary configuration of tiles 52 within a room 90 of a data center or a portion of a data center are shown. As shown, the room 90 includes several rows of servers, each indicated at 92, which are arranged parallel to one another. The room 90 further may include one or more computer room air conditioning CRAC units, each indicated at 94, positioned at a periphery of the room. Between adjacent rows of servers 92 are a line of tiles 52, with each tile being configured to draw air through its grille element 54 from above and below the tile and direct the air to the control station 66 for detection. It should be understood that the room 90 of the data center can be arranged in any suitable manner with the tiles 52 strategically positioned to detect refrigerant leaks from cooling units positioned within the rows of equipment racks and/or the CRAC units 94.

Figure 6A:
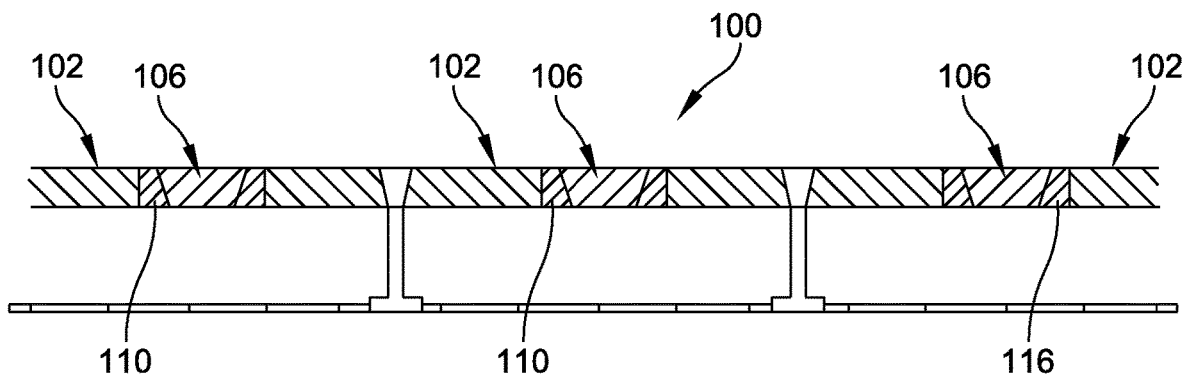
FIG. 6A is a schematic view of a system of a plurality of tiles of another embodiment of the present disclosure that are configured to detect refrigerant leaks.
Figure 6B:
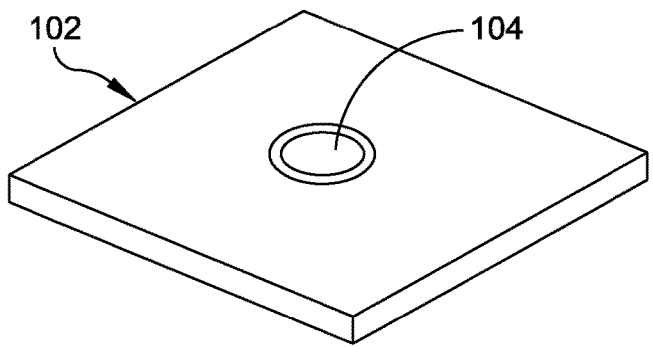
FIG. 6B is a perspective view of a tile shown in FIG. 6A.
Figure 6C:
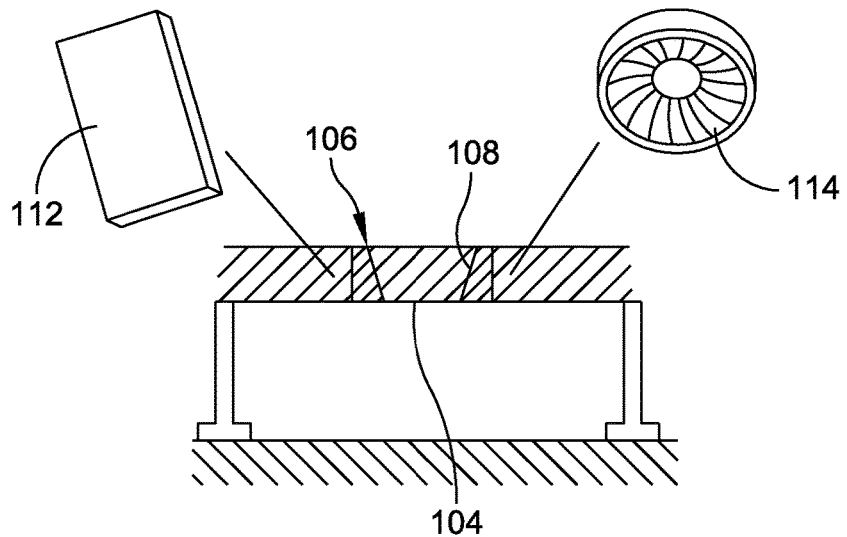
FIG. 6C is a schematic side view of a tile shown in FIG. 6A.

Referring to FIGS. 6A-6C, a system of another embodiment of the present disclosure is generally indicated at 100. As shown, the system 100 includes a plurality of tiles, each generally indicated at 102, with each tile having a body. The system 100 further includes a control box, generally indicated at 106, that is configured to fit within a cavity 108 formed in the body of the tile 102. The control box 106 has a pair of grille elements, each indicated at 104 (FIGS. 6B and 6C), positioned on opposite sides of the body of the tile 102. The arrangement is such that the grill elements 104 are configured to draw air from over a top of the body of the tile 102 and from a bottom of the body of the tile into the control box 106. The control box 106 is integrated in the tile 102 and contains, in one embodiment, light elements, each indicated at 110. In one embodiment, the light elements 110 include a first color, e.g., green lights, for normal operation and a second color, e.g., red lights, for an alarm. The control box 106 further includes a refrigerant sensing device 112, a miniaturized fan 114, and a Zigbee wireless communication block (network). Each control box 106 can be powered by means of a wire 116 connected to a power source, with the control boxes of adjacent tiles 102 being connected to one another serially or in parallel.

Figure 7:
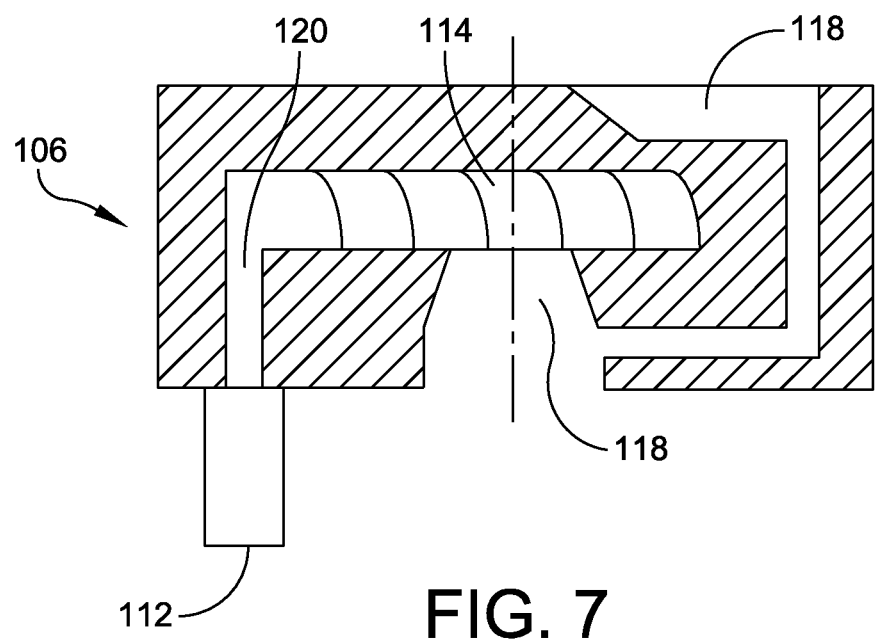
FIG. 7 is a detailed schematic view of an exemplary fan arrangement and suction openings within a tile.

Referring to FIG. 7, an exemplary control box 106 is illustrated. As shown, the control box 106 includes a fan 114 positioned to draw air into the control box from above and below the control box. Specifically, the control box 106 includes suction openings, each indicated at 118, through which air is drawn into the control box from the top and the bottom of the body of the tile 102 by the fan 114. The control box 106 further includes a discharge opening 120, which is positioned to receive air from the fan 114. The sensing device 112 is position adjacent the discharge opening 120 to detect moisture, e.g., refrigerant, in the air.

In operation, each tile 102 of system 100 as described above, draws air both above and below the floor defined by the tiles in a continuous fashion. In the event of the presence of refrigerant in the air, a signal is sent from the control box 106 to the central station of the data center that, in turn, can generate a signal to trigger an alarm or other notification to take countermeasures against the refrigerant leak.

In some embodiments, the control box includes a communication module configured to create a communication network among other tiles and a central station, with the central station being able to receive a signal triggering an alarm from any tile in case of refrigerant leakage detection.

Figure 8:
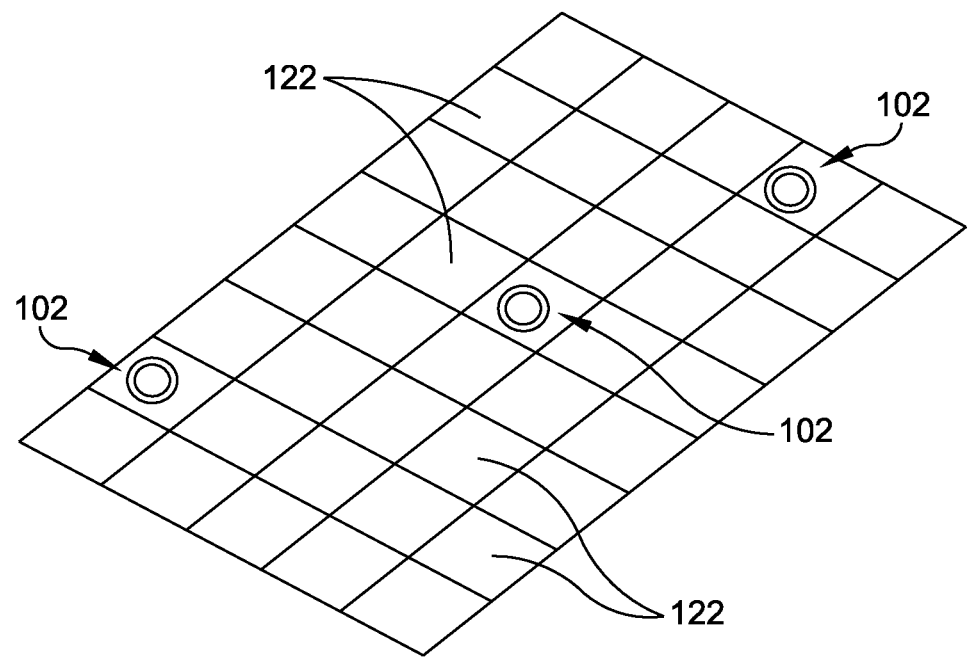
FIG. 8 is a schematic view of positioning of tiles.

Referring to FIG. 8, in one embodiment, a plurality of "standard" tiles, each indicated at 122, are employed within a room, with tiles 102 interspersed between the "standard"

tiles. As shown, tiles 102 can be located anywhere and freely moved in other positions, if necessary. The Zigbee network associated with the control box 106 of each tile 102 enables the tiles to be able to communicate to other tiles.

Figure 9:
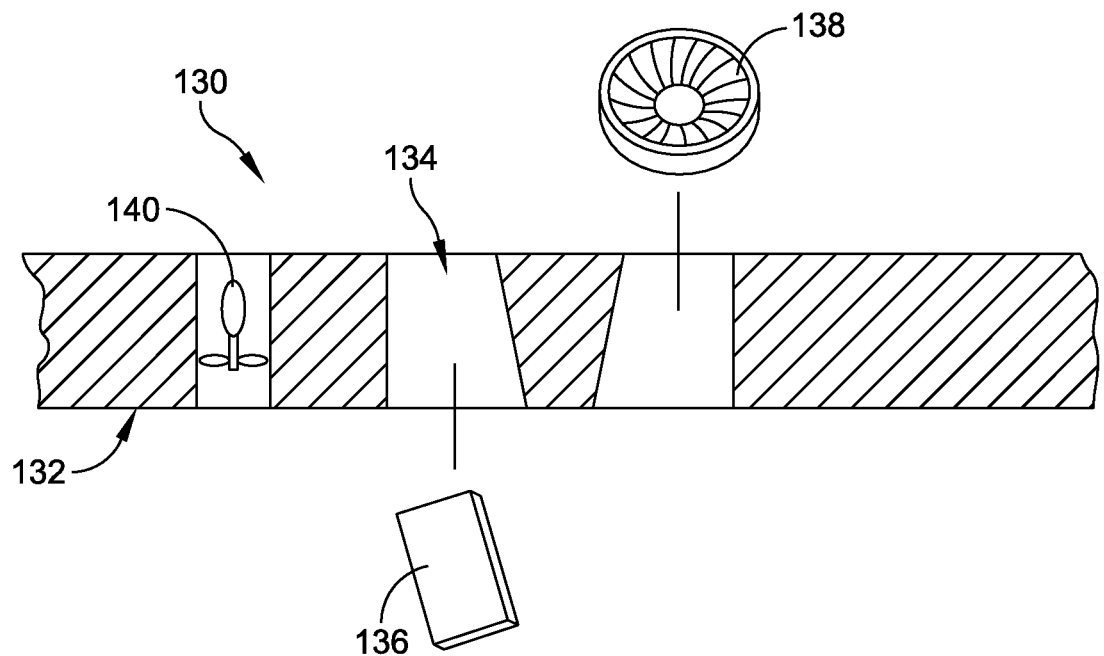
FIG. 9 is a schematic view of a system of a plurality of tiles of another embodiment of the present disclosure that are configured to detect refrigerant leaks.

Referring to FIG. 9, similar to the system 100 shown in FIGS. 6A-6C, a system, generally indicated at 130, of another embodiment includes a tile generally indicated at 132. The system 130 further includes a control box generally indicated at 134, which is positioned within the tile 132. In one embodiment, the control box 134 includes a sensing device 136 and a fan 138. As shown, the system 130 further includes a mini turbine and a power generator, collectively indicated at 140. Instead of power being supplied to each tile 132 by means of a wire, the mini turbine and power generator 140 can provide the power required to operate the tile. The mini turbine and power generator 140 are operated by the pressure existing under the floor. The mini turbine and power generator 140 supplies power to the control box 134 to operate light elements, e.g., green and red alarm lights, and the fan 138. The system 130 further may include a back-up battery to power the tile.

Figure 10:
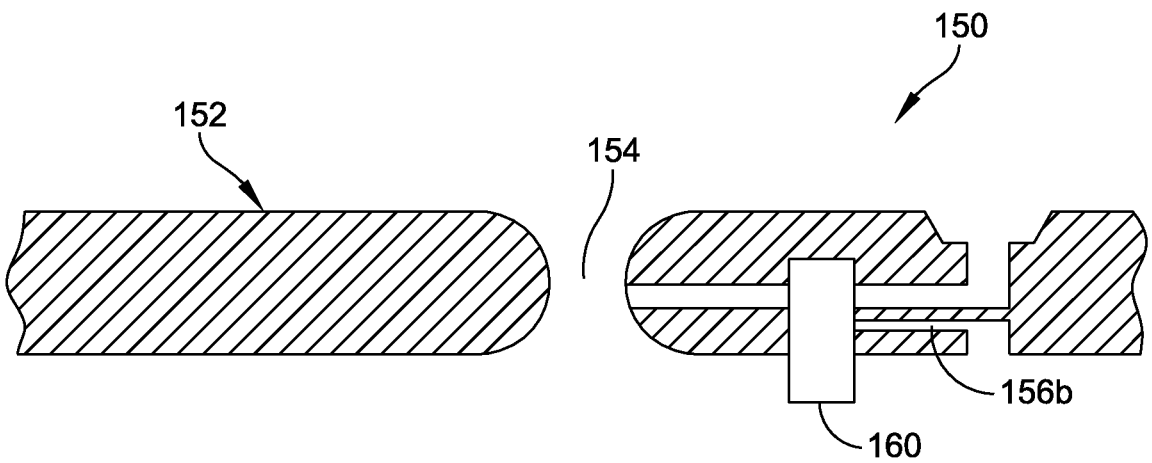
FIG. 10 is a schematic view of a system of a plurality of tiles of another embodiment of the present disclosure that are configured to detect refrigerant leaks.

Referring to FIG. 10, similar to the systems 100 and 130 shown in FIGS. 6A-6C and FIG. 8, respectively, a system generally indicated at 150 of another embodiment includes a tile generally indicated at 152 having a depressurized area 154 and two channels, each indicated at 156. Instead of a miniaturized fan, a venturi effect is created by the channel 154 since the pressure under the floor pushes air through the channel. The depressurized area generated consequently can draw air from the top by means of channels 156*a* and from the bottom by means of channel 156*b*. The system 150 further includes a sensor device 160, which is positioned along the channels 156, to detect refrigerant in the air passing through the sensor device.

As shown, advantages of embodiments of the present disclosure include, and are not limited to a system including a tile for access floor, with the system further including a device that is configured to draw air both from the upper surface of the tile and from the bottom surface of the tile. The system further includes a monitoring device able to detect refrigerant dispersed in the air and a communication module able to create a communication network among other tiles and a central station. The central station able to receive an alarm from any tile in case of refrigerant leakage detection.

Various controllers, such as the controllers 24 and 68, may execute various operations discussed above. Using data stored in associated memory and/or storage, the controllers may also execute one or more instructions stored on one or more non-transitory computer-readable media that may result in manipulated data. In some examples, the controllers may include one or more processors or other types of controllers. In one example, the controllers are or include a commercially available, general-purpose processor. In another example, the controllers perform at least a portion of the operations discussed above using an application-specific integrated circuit tailored to perform particular operations in addition to, or in lieu of, a general-purpose processor. As illustrated by these examples, examples in accordance with the present invention may perform the operations described herein using many specific combinations of hardware and software and the invention is not limited to any particular combination of hardware and software components.

Having thus described several aspects of at least one embodiment of this disclosure, it is to be appreciated various alterations, modifications, and improvements can readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A floor system for detecting refrigerant, the floor system comprising:
   one or more tiles, each tile including
      a tile body having a cavity formed therein,
      a grille element positioned within the cavity of the tile body, the grille element being configured to receive air from at least one of above or below the tile body, and
      a control assembly associated with the grille element, the control assembly including a refrigerant sensor to detect refrigerant in the received air,
      wherein the control assembly is configured to output a signal indicating a detection of refrigerant.

2. The floor system of claim 1, wherein the control assembly further includes a fan to draw in the received air into the grille from at least one of above or below the tile body.

3. The floor system of claim 1, further comprising one or more light elements configured to indicate a detection of refrigerant detected by the refrigerant sensor.

4. The floor system of claim 3, wherein the one or more light elements includes at least one of a first color light to indicate normal operation or a second color light to indicate an alarm related to the refrigerant sensor.

5. The floor system of claim 3, wherein the control assembly further includes a control box, and wherein each grille element is positioned inside the control box.

6. The floor system of claim 2, further comprising a wireless communication network.

7. The floor system of claim 1, wherein each tile is powered by a power source coupled to the control assembly.

8. The floor system of claim 1, wherein the grille element has a shape that is configured to fit within a mating shaped cavity in the body of the tile.

9. The floor system of claim 1, wherein each grille element is connected to a grille element of an adjacent tile by a pipe element.

10. The floor system of claim 1, wherein the control assembly is provided in the grille element.

11. The floor system of claim 1, wherein the one or more tiles are supported above a floor by one or more supports, the one or more tiles defining a top surface of a plenum through which air can be delivered to racks containing electronic equipment.

12. The floor system of claim 1, wherein the control assembly further includes a communication module configured to create a wireless network communication network with other tiles of the one or more tiles.

13. The floor system of claim 1, wherein the control assembly is configured to communication with a central station in which the central station is configured to receive an alarm from any tile in case of refrigerant leakage detection by the sensor.

14. The floor system of claim 1, wherein each grille element is connected to an adjacent grille element by a connector, with the control assembly being positioned remote from the tile.

15. The floor system of claim 14, wherein each connection element is located along a respective side of the grille element and provided with snap connectors configured to solidly connect the grille elements to establish a continuity of a channel and of an electrical circuit for an alarm light by means of electrical contacts.

16. The floor system of claim 1, wherein each tile is powered by a mini turbine and power generator coupled to the tile by pressure existing under the floor.

17. The floor system of claim 1, wherein the body of the tile includes a depressurized area and one or more channels, wherein the system further is configured to create a venturi effect adjacent the depressurized area to draw air through the one or more channels.

18. The floor system of claim 1, wherein the one or more tiles are supported above a floor by one or more supports, the one or more supports each being configured to deliver power to the control assembly of the one or more tiles.

19. One or more non-transitory machine-readable media storing instructions that, when executed by one or more processors, cause a floor system to perform a method, the floor system being configured to detect refrigerant in received air within tiles of the floor system, the method comprising:
   detecting refrigerant in received air by a refrigerant sensor of a control assembly of one or more tiles of the floor system, each tile including a tile body having a cavity formed therein and a grille element positioned within the cavity of the tile body, the grille element being configured to receive air from at least one of above or below the tile body into the cavity for detection, the control assembly being associated with the grille element; and
   outputting a signal indicating a detection of refrigerant.

20. The one or more non-transitory machine-readable media of claim 19, wherein outputting a signal indicating a detection of refrigerant includes activating one or more light elements including at least one of a first color light to indicate normal operation or a second color light to indicate an alarm related to the refrigerant sensor configured to detect moisture in air.

21. The one or more non-transitory machine-readable media of claim 19, further comprising a wireless communication network.

22. The one or more non-transitory machine-readable media of claim 19, wherein each tile is powered by a power source coupled to the control assembly.

23. The one or more non-transitory machine-readable media of claim 19, wherein the control assembly further includes a communication module configured to create a communication network with other tiles of the one or more tiles and a central station.

24. The one or more non-transitory machine-readable media of claim 19, wherein the central station is configured to receive an alarm from any tile in case of refrigerant leakage detection by the refrigerant sensor.

* * * * *